(12) United States Patent
de Haas

(10) Patent No.: US 8,970,260 B1
(45) Date of Patent: Mar. 3, 2015

(54) OUTPUT DRIVERS

(71) Applicant: NXP B.V., Eindhoven (NL)

(72) Inventor: Clemens Gerhardus Johannes de Haas, Ewijk (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/086,119

(22) Filed: Nov. 21, 2013

(51) Int. Cl.
*H03K 3/00* (2006.01)
*H03K 3/011* (2006.01)

(52) U.S. Cl.
CPC ..................................... *H03K 3/011* (2013.01)
USPC ........................................................ 327/108

(58) Field of Classification Search
None
See application file for complete search history.

(56) References Cited

U.S. PATENT DOCUMENTS

| | | | | |
|---|---|---|---|---|
| 4,827,242 A | * | 5/1989 | Blankenship et al. | 340/450 |
| 5,796,276 A | * | 8/1998 | Phillips et al. | 327/108 |
| 8,373,404 B2 | * | 2/2013 | Chuang et al. | 323/284 |
| 8,680,710 B2 | * | 3/2014 | Nogawa | 307/43 |
| 2006/0176091 A1 | * | 8/2006 | Sakiyama et al. | 327/158 |
| 2008/0180151 A1 | * | 7/2008 | Gong et al. | 327/175 |
| 2011/0291707 A1 | * | 12/2011 | Illegems | 327/108 |
| 2012/0062281 A1 | * | 3/2012 | Briere et al. | 327/109 |
| 2012/0300499 A1 | * | 11/2012 | Chang et al. | 363/16 |
| 2013/0093474 A1 | * | 4/2013 | Yang et al. | 327/109 |
| 2013/0113450 A1 | * | 5/2013 | Tang et al. | 323/283 |

* cited by examiner

*Primary Examiner* — Lincoln Donovan
*Assistant Examiner* — Khareem E Almo

(57) ABSTRACT

Various aspects of the disclosure are directed to methods and apparatuses involving communications. As consistent with one or more embodiments, first and second sets of multiple current drivers are implemented respectively in a high-side and a low-side circuit. Current is driven via an output port in the high-side circuit by activating the first set of multiple current drivers until a steady-state high voltage is detected, and by deactivating one of the current drivers in the first set when the steady-state high voltage is detected. Current is driven in the low-side circuit by activating the second set of multiple current drivers until a steady-state low voltage is detected, and by deactivating one of the current drivers in the second set when the steady-state low voltage is detected.

20 Claims, 5 Drawing Sheets

OUTPUT DRIVERS

Aspects of various embodiments are directed to output drivers.

Communications between respective circuits are often effected using driver circuits. In many such applications, reference voltages are needed to protect output devices in the event that a high voltage is present on a power supply (VDD) and/or input (IN) pin. This means the current consumed by the circuit that generates these voltages is always present. However, this can be undesirable as low power requirements are important for many circuits, such that non-functional circuits are desirably disabled, and that quiescent current is held low.

In applications in which one supply voltage is used at a consistent temperature, devices can be scaled such that an output current is equal. However, over a common supply range of voltages (e.g., 3V to 5.5V), and over a larger temperature range (e.g., −40° C. to 175° C.), there can be a significant spread in output current. This can undesirably result in asymmetrical propagation delay.

Further, it can be difficult to implement a current source with a high-voltage transistor (e.g., greater than 7V) having a fast turn-on and turn-off delay (e.g., less than 10 ns), and which uses low quiescent current. For example, a current source using a current mirror having a 1:10 ratio can be turned on quickly, as $\frac{1}{10}^{th}$ of the output current is used to charge a gate-source capacitance. However, turnoff for such a current source is much slower because the gate-source capacitance needs to be discharged via the transconductance of an input transistor. Improving the turn-off delay time by actively shorting the gate-source with a switch would require a high-voltage level shifter, which would introduce also a delay. Also the steady state current will be $\frac{1}{10}^{th}$ of the output current, which can be very high compared to many CMOS output buffers, which have a steady state current of zero.

These and other matters have presented challenges to a variety of circuit applications, such as those involving output drivers and those susceptible to high supply voltages.

Various example embodiments are directed to output drivers and their implementation, and to addressing challenges including those discussed above.

According to an example embodiment, an integrated circuit chip is used in an automotive electrical communication apparatus, and includes first and second sets of multiple current drivers, and a signal-driver circuit having high-side and low-side circuits that drive current via an output port at which an output signal is provided. The high-side circuit drives current via the output port by activating the first set of multiple current drivers until a steady-state high voltage is detected, and by deactivating one of the current drivers in the first set when the steady-state high voltage is detected. The low-side circuit drives current via the output port by activating the second set of multiple current drivers until a steady-state low voltage is detected, and by deactivating one of the current drivers in the second set when the steady-state low voltage is detected.

Another embodiment is directed to a peripheral device that communicates with a microcontroller via an automotive network, and having a communication circuit including an input port at which signals are received from the microcontroller, as well as an output port at which an output signal is provided to the microcontroller. The peripheral device has high-side and low-side circuits that respectively use first and second sets of current drivers as discussed above. In a more particular embodiment, each set of current drivers includes a static current driver that provides a low current and a sloped current driver that provides a high current, and that generate the output signal exhibiting a voltage level as follows. A steady-state low value is provided by activating the static current driver of the low-side circuit and by operating each of the sloped current driver of the low-side circuit and both the static and sloped current drivers of the high-side circuit in a deactivated mode. A rising edge is provided by activating the sloped current driver and the static current driver of the high-side circuit and by operating the sloped current driver and the static current driver of the low-side circuit in a deactivated mode. A steady-state high value is provided by activating the static current driver of the high-side circuit, and by operating the sloped current driver of the high-side circuit and both the static and sloped current drivers of the low-side circuit in a deactivated mode. A falling edge is provided by activating the sloped current driver and the static current driver of the low-side circuit, and by operating the sloped current driver and the static current driver of the high-side circuit in a deactivated mode.

Another embodiment is directed to a method for use in an integrated circuit chip of an automotive electrical communication apparatus, as follows. In a high-side circuit, current is driven via an output port at which an output signal is provided by activating a first set of multiple current drivers until a steady-state high voltage is detected, and by deactivating one of the current drivers in the first set when the steady-state high voltage is detected. In a low-side circuit, current is driven via the output port by activating a second set of multiple current drivers until a steady-state low voltage is detected, and by deactivating one of the current drivers in the second set when the steady-state low voltage is detected.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

Figure 1:
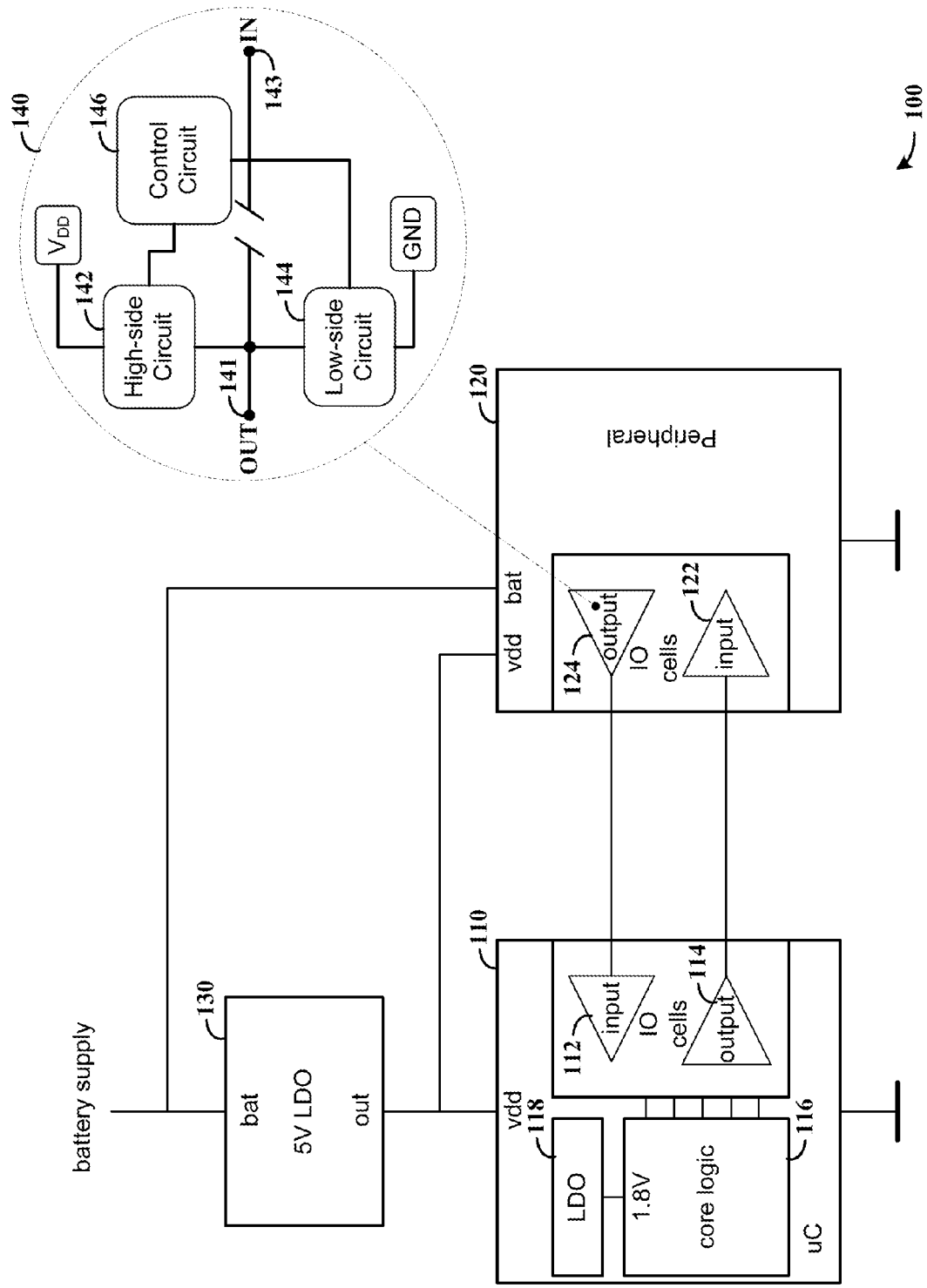
FIG. 1 shows a communication apparatus, in accordance with an embodiment.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

Aspects of the present disclosure are believed to be applicable to a variety of different types of apparatuses, systems and methods involving communications, including those employing output drivers. While not necessarily so limited, various aspects may be appreciated through a discussion of examples using this context.

Various example embodiments are directed to an output driver, such as may be used in logic interface between two integrated circuits (ICs), which can withstand high supply voltages and may exhibit symmetrical propagation delay. Such output drivers may, for example, be used in circuits in which a maximum gate-oxide voltage of transistors tolerate and support a zero quiescent current power down mode. Such embodiments may be implemented in quiescent current applications, such as automotive applications involving an in-vehicle network (IVN).

In accordance with one or more particular embodiments, such as may be used in automotive communications (e.g., between a peripheral device and a microcontroller), respective sets of current drivers are operated to drive current via an output port at which an output signal is provided. The respective drivers are operated to provide a steady-state low value, a rising edge, a steady-state high value and a falling edge of the output signal. In some embodiments, the output signal is provided as such by activating a high-side set of current drivers until a steady-state high voltage is detected, and deactivating one of the high-side current drivers when the steady-state high voltage is detected (e.g., after the high voltage level is reached). The output signal is further provided by activating a low-side circuit set of multiple current drivers until a steady-state low voltage is detected, and by deactivating one of the current drivers in the second set when the steady-state low voltage is detected.

In a more particular embodiment, each set of current drivers includes a static current driver that provides a low current, and a sloped current driver that provides a high current. A steady-state low value is provided by activating the static current driver of the low-side circuit and by operating each of the sloped current driver of the low-side circuit and both the static and sloped current drivers of the high-side circuit in a deactivated mode. A rising edge is provided by activating the sloped current driver and the static current driver of the high-side circuit and by operating the sloped current driver and the static current driver of the low-side circuit in a deactivated mode. A steady-state high value is provided by activating the static current driver of the high-side circuit, and by operating the sloped current driver of the high-side circuit and both the static and sloped current drivers of the low-side circuit in a deactivated mode. A falling edge is provided by activating the sloped current driver and the static current driver of the low-side circuit, and by operating the sloped current driver and the static current driver of the high-side circuit in a deactivated mode.

In accordance with a particular embodiment, an integrated circuit chip as may be used in an automotive electrical communication apparatus, includes an output port at which an output signal is provided, first and second sets of multiple current drivers, and a signal-driver circuit. The signal-driver circuit includes a high-side circuit that drives current via the output port by activating the first set of multiple current drivers until a steady-state high voltage is detected, and by deactivating one of the current drivers in the first set when the steady-state high voltage is detected. The low-side circuit drives current via the output port by activating the second set of multiple current drivers until a steady-state low voltage is detected, and by deactivating one of the current drivers in the second set when the steady-state low voltage is detected. In some implementations, the current drivers on the high and low sides mirror one another, and provide current of equal magnitude and opposite sign.

The current drivers are controlled using one or more of a variety of approaches. In one embodiment, the integrated circuit chip also includes one or more control circuits that provide a control signal for a condition in which the output port provides the steady-state high voltage and/or the steady-state low voltage. In some embodiments, a feedback circuit having a comparator is coupled to the output port, and provides an output indicative of a voltage level on the output port. This output is used in controlling the current drivers.

In a more particular embodiment, each set of multiple current drivers includes a static current driver that provides a low current, and a sloped current driver configured and arranged to provide a high current. The high-side circuit includes first and second switches that respectively couple the static and sloped current drivers of the high-side circuit between a voltage source and the output port. The first switch is responsive to an input voltage level and the second switch is responsive to the input voltage level and the output of the feedback circuit. The low-side circuit includes third and fourth switches that respectively couple the static and sloped current drivers of the low-side circuit between the output port and a reference voltage. The third switch is responsive to the input voltage level and the fourth switch is responsive to the input voltage level and the output of the feedback circuit.

In some embodiments, the high-side circuit activates the first set of multiple current drivers until the steady-state high voltage is detected by driving a first one of the current drivers in the first set to provide a high current, and by driving a second one of the current drivers in the first set to provide a low current, therein providing a rising edge of a voltage level on the output port. One of the current drivers in the first set is deactivated when the steady-state high voltage is detected by deactivating the first one of the current drivers in the first set, therein providing a steady state voltage level on the output port.

As may be implemented separately or together with the operation of the high-side circuit in the preceding paragraph, in some embodiments the low-side circuit activates the second set of multiple current drivers until the steady-state low voltage is detected by driving a first one of the current drivers in the second set to provide a high current, and by driving a second one of the current drivers in the second set to provide a low current, therein providing a falling edge of a voltage level on the output port. One of the current drivers in the second set is deactivated when the steady-state high voltage is detected, by deactivating the first one of the current drivers in the second set, therein providing a steady state voltage level.

In some embodiments, each set of multiple current drivers includes a static current driver that provides a low current and a sloped current driver that provides a high current. The signal-driver circuit generates the output signal exhibiting voltages as follows: a steady-state low value by activating the static current driver of the low-side circuit, a rising edge by activating the sloped current driver and the static current driver of the high-side circuit, a steady-state high value by activating the static current driver of the high-side circuit, and a falling edge by activating the sloped current driver and the static current driver of the low-side circuit. In some implementations, the respective voltages are provided by concurrently deactivating those current drivers not used as above.

Various embodiments are directed to methods consistent with embodiments herein, such as described in connection with one or more apparatuses. In some embodiments, a method-based approach involves using a high-side circuit and driving current via an output port at which an output signal is provided, by activating a first set of multiple current drivers until a steady-state high voltage is detected and by deactivating one of the current drivers in the first set when the steady-state high voltage is detected. Current is driven in a low-side circuit by activating a second set of multiple current drivers until a steady-state low voltage is detected, and by deactivating one of the current drivers in the second set when the steady-state low voltage is detected.

In some implementations, the method-based steps of driving current may include providing respective control signals for driving current in the high-side circuit and in the low-side circuit. In some implementations, such a method involves selectively driving static and sloped current drivers to provide low and high current, such as to provide the steady-state and rising/falling edges discussed above. These approaches may involve activating, and in some instances deactivating, respective static/sloped drivers as described. In a particular embodiment, the static and sloped current drivers are operated by coupling high-side drivers between a voltage source and the output port based on an input voltage level and feedback indicative of a voltage level on the output port, and by coupling low-side drivers between the output port and a reference voltage in response to the input voltage level and the feedback.

In some embodiments, the first set of multiple current drivers is activated until a steady-state high voltage is detected by driving a first one of the current drivers in the first set to provide a high current and by driving a second one of the current drivers in the first set to provide a low current, therein providing a rising edge of a voltage level on the output port. One of the current drivers in the first set is deactivated when the steady-state high voltage is detected, therein providing a steady-state voltage level on the output port. As may be implemented with the high-side activation and/or separately, in some embodiments the second set of current drivers is activated until the steady-state low voltage is detected by driving a first one of the current drivers in the second set to provide a high current and by driving a second one of the current drivers in the second set to provide a low current, therein providing a falling edge of a voltage level on the output port. One of the current drivers in the second set is deactivated when the steady-state high voltage is detected, therein providing a steady-state voltage level.

Various embodiments as described herein are applicable for use in a variety of different types of circuits, apparatuses and systems. In some implementations, embodiments herein are implemented in a controller area network (CAN) transceiver such as a CANFD transceiver (with flexible data rates), in which symmetry of a loop-back delay from a receiver to a transmitter is important. Such implementations may, for example, withstand at least 7V when disabled, under which conditions current consumption is effectively 0 uA (e.g., the consumption being limited to leakage), with 3.3V gate-oxide transistors. In certain embodiments, peak supply cross-current is limited to mitigate or prevent high frequencies, which can otherwise generate an emission, adding desirable delay and potential asymmetry before issues may occur.

Turning now to the Figures, FIG. 1 shows a communication apparatus 100, in accordance with an example embodiment of the present invention. The apparatus 100 includes a variety of components, which may be implemented separately in respective embodiments, combined in part or as a whole, for a variety of applications such as with an automotive communication circuit. A microcontroller 110 communicates with a peripheral device 120, each of which is powered by a battery supply and via regulator 130 ($V_{DD}$ shown by way of example as a 5V LDO regulator). The microcontroller 110 includes input and output drivers 112 and 114, which respectively communicate with output and input drivers 124 and 122, core logic 116, and an LDO component 118.

In some embodiments, the output driver 124 includes circuits as shown in the inset 140, which provide an output at an output port 141. A high-side circuit 142 is connected to $V_{DD}$ and an output port 141, and a low-side circuit 144 is connected to the output port and a reference or ground-level voltage (e.g., as represented by GND). A control circuit 146 operates to control the high-side and low-side circuits 142 and 144, to provide an output at the output port 141 based on a value at input port 143.

In some embodiments, the output driver 124 implements current drivers in each of the high-side and low-side circuits, which respectively operate with the control circuit 146 to provide the output. The high-side circuit 142 operates with the control circuit 146 to drive current via the output port 141 by activating a first set of multiple current drivers until a steady-state high voltage is detected, and by deactivating one of the current drivers in the first set when the steady-state high voltage is detected. The low-side circuit 144 operates with the control circuit 146 to drive current via the output port 141 by activating a second set of multiple current drivers until a steady-state low voltage is detected, and by deactivating one of the current drivers in the second set when the steady-state low voltage is detected.

Figure 2:
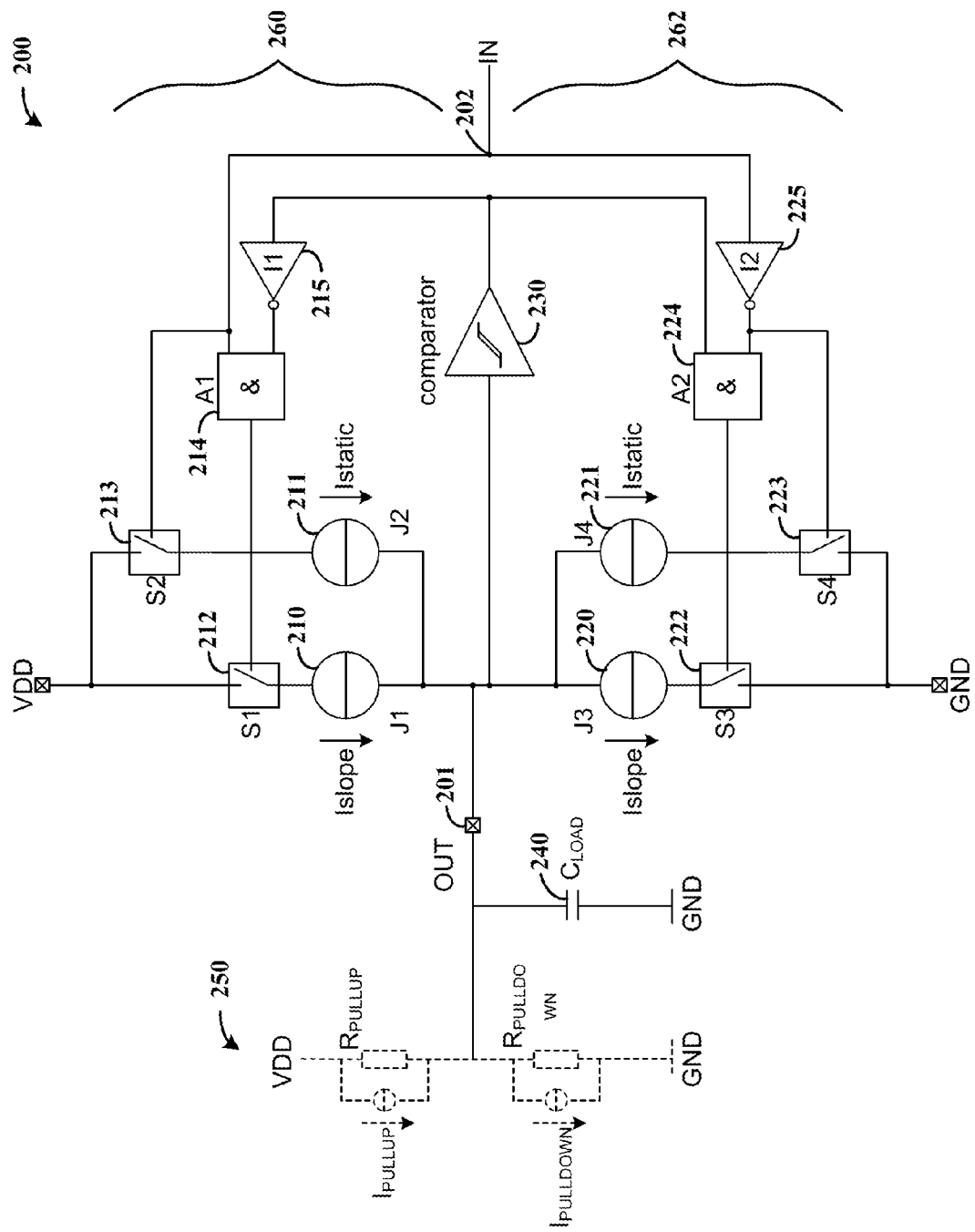
FIG. 2 shows an output driver circuit, in accordance with another embodiment.

FIG. 2 shows an output driver circuit 200 that provides an output at output port 201 based upon an input at an input port 202, in accordance with another embodiment. The circuit 200 includes, on a high side, a sloped current driver 210 and a static current driver 211 that are connected to the output port 201, and that are also connected to a supply voltage ($V_{DD}$) via switches 212 and 213, respectively. Control circuitry 214 and 215 control the operation of switches 212 and 213, based on a signal at the input port 202 and an output of comparator 230, which is coupled to the output port 201. The circuit 200 also includes, on a low side, a sloped current driver 220 and a static current driver 221, which are also connected to the output port 201, and to a reference/ground node (GND) via switches 222 and 223. Control circuitry 224 and 225 control the operation of switches 222 and 223, based on a signal at the input port 202 and an output of the comparator 230.

By way of example, the output port 201 is shown connected to a load 240, on a communication link operating using pull-up and pull-down circuits at 250, which facilitate communication. To provide an output, the sloped current driver 210 provides a high current, and the static current driver 211 provides a low current, at a high (positive). The sloped current driver 220 provides a high current, and the static current driver 221 provides a low current, at a low (negative) level. In some implementations, high-side circuits at 260 are generally mirrored with low-side circuits at 262, with the comparator 230 serving both.

The current drivers can be implemented as controlled current sources that generate positive or negative output current, which are matched for symmetry. Problems relating to turn-on and turn-off, as discussed above, can be mitigated in this regard. For instance, by implementing the following operational conditions in connection with the circuit 200:

| | |
|---|---|
| steady-state low: | switch S4 (223) is closed, J4 (221) is active, $I_{OUT} = I_{STATIC}$ |
| rising edge: | S1&S2 (212, 213) are closed, J1&J2 (210, 211) are active, $I_{OUT} = -(I_{STATIC} + I_{SLOPE})$ |
| steady-state high: | S2 (213) is closed, J2 (211) is active, $I_{OUT} = -I_{STATIC}$ |
| falling edge: | S3&S4 (222, 223) are closed, J3&J4 (220, 221) are active, $I_{OUT} = (I_{STATIC} + I_{SLOPE})$ |

The static and sloped current drivers are implemented in a variety of manners to suit particular embodiments. In one embodiment, the sloped current on one or both of the high and low sides is set to at least 10 mA (5*20p/10n) to achieve a propagation delay of less than about 10 ns at $V_{DD}$=5V and $C_{LOAD}$=20 pF. For instance, if there is a leakage current of 250 μA or less present in an application connected to the output port 201, the static current only need be a maximum 250 μA. If a pull-up or pull-down resistor is present in the application with a minimum of 10 kΩ the static current is set to at least 400 μA (5-0.4/10k→drop voltage of 400 mV). If $I_{SLOPE}$=10 mA and $I_{STATIC}$=500 μA, and if the sloped current drivers are implemented with a ratio of 1:10 the steady state current would be 50 μA. When the opposite phase starts, the static current source is turned off, thus reducing delay error and addressing issues as above (e.g., as the slope current of 10 mA is much bigger than the static current of 500 μA).

Different states for the above-discussed low, high and edge states can be detected by the comparator 230, which is responsive to the output voltage. In some implementations, the comparator 230 is also used for input circuitry, and the output driver is combined with an input comparator to create an input-output cell. The input comparator may have different high and low levels (hysteresis), such as with a high level can of $\frac{2}{3}*V_{DD}$ and a low-level that is $\frac{1}{3}*V_{DD}$. In some implementations, the comparator levels are the same or larger than the levels of the input circuit in the application which this output circuit is driving.

Figure 3:
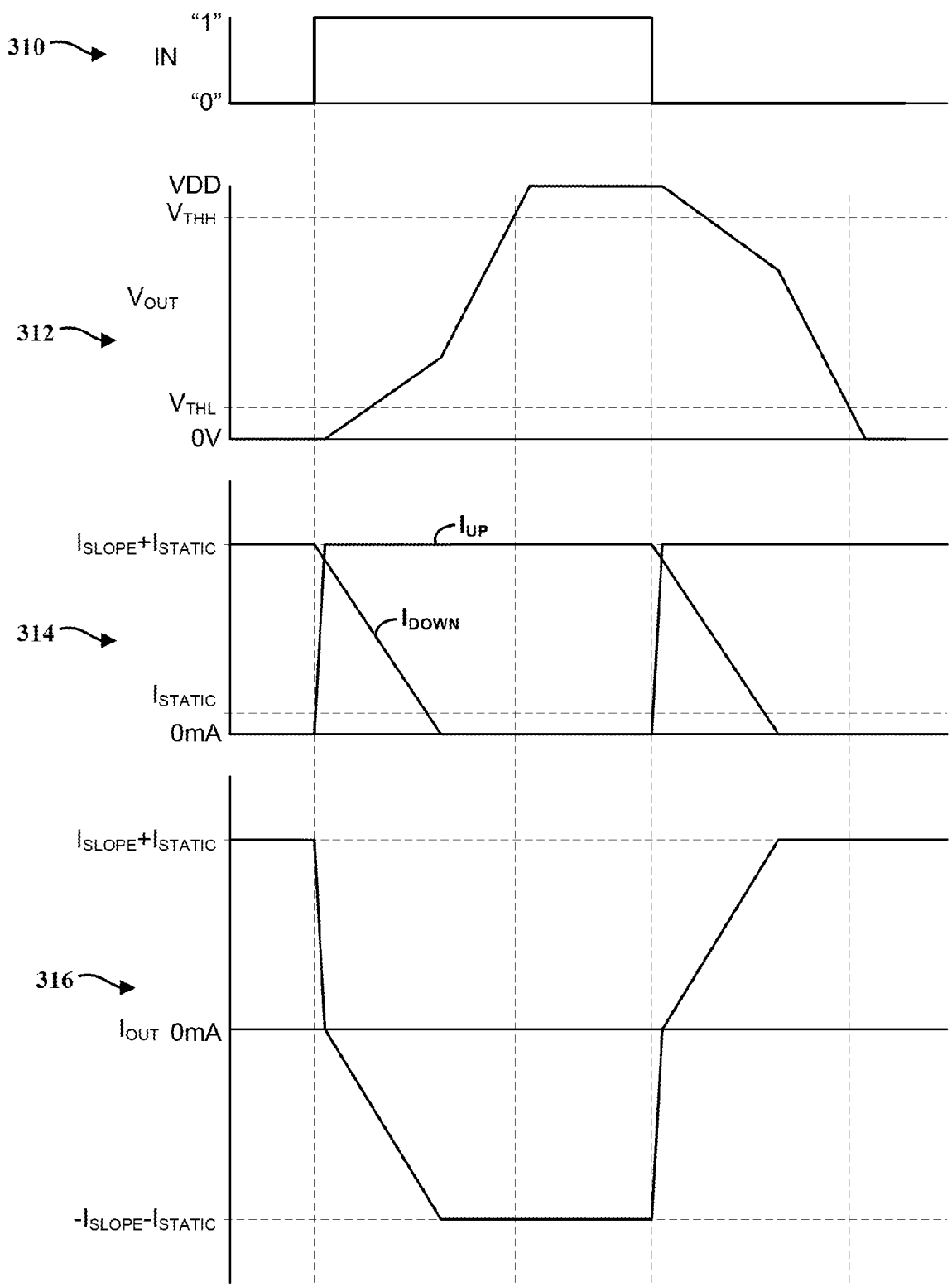
FIG. 3 shows plots of operation of an output driver circuit, in accordance with another embodiment.

FIG. 3 shows plots of operation of an output driver circuit, in accordance with another embodiment. These operational characteristics may, for example, be implemented with the circuits shown in FIGS. 1 and 2, or as otherwise described herein. An input value is shown at 310, an output is shown at 312, increasing and decreasing ($I_{UP}$ and $I_{DOWN}$) current values are shown at 314, and a combined signal is shown at 316. The signals are shown with a high-side and a low-side current source, with faster turn-on delay compared to turn-off delay. The propagation delay is mainly determined by the turn-off delay.

Figure 4:
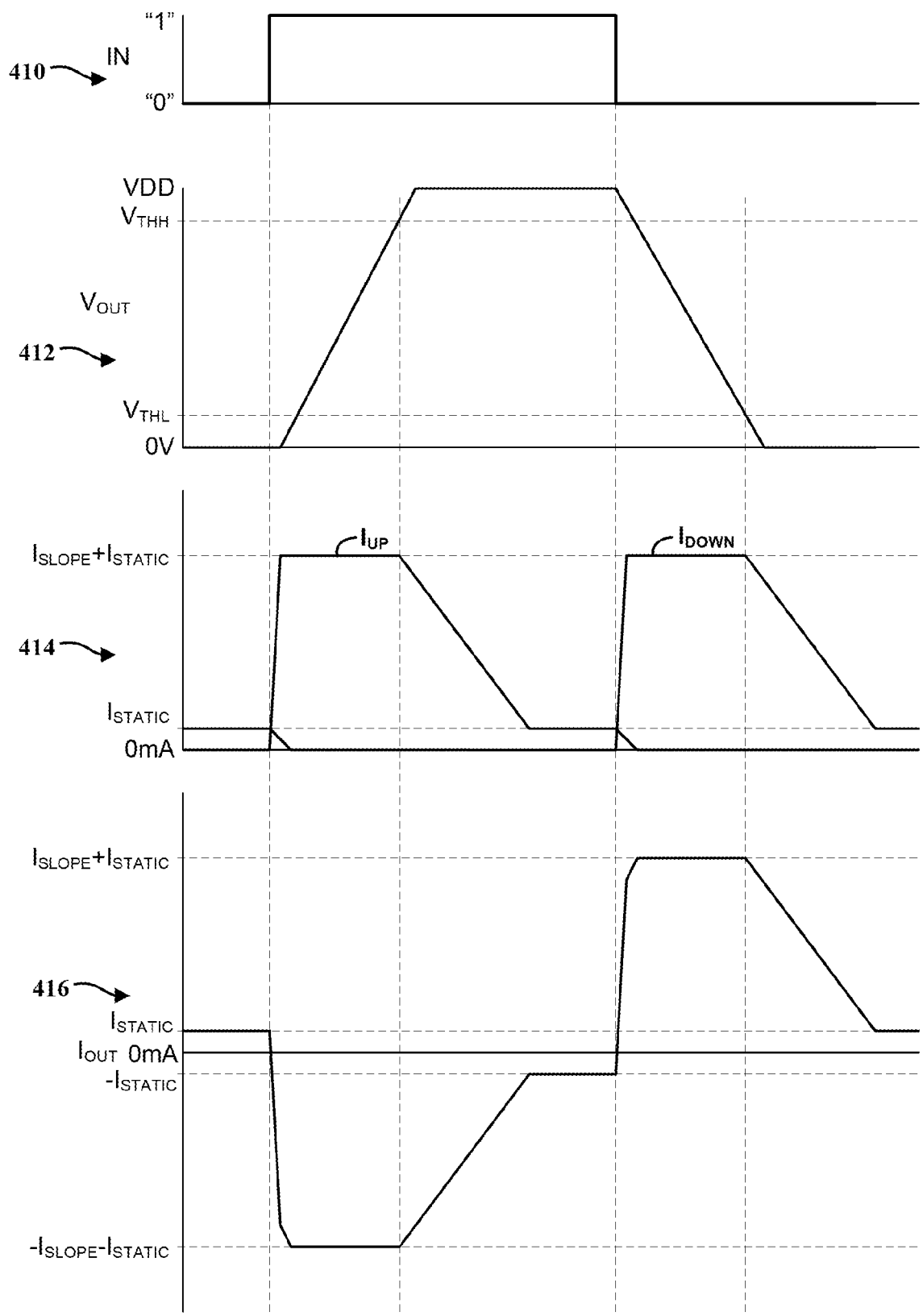
FIG. 4 shows plots of operation of an output driver circuit, in accordance with another embodiment.

FIG. 4 shows plots of operation of an output driver circuit, in accordance with another embodiment. As above, the operation may be implemented with the circuits shown in FIGS. 1 and 2, or as otherwise described herein. Plot 410 shows an input signal, and plot 412 shows an output signal. Plot 414 shows increasing and decreasing ($I_{UP}$ and $I_{DOWN}$) current values, with plot 416 showing a combined signal. The relatively slow turn-off delay transition happens while the signal is in steady-state, with the delay not being part of the signal propagation delay, which can address problems as discussed above. The propagation symmetry in this regard can be matched based upon the value of the DC current of the current drivers/sources.

Figure 5:
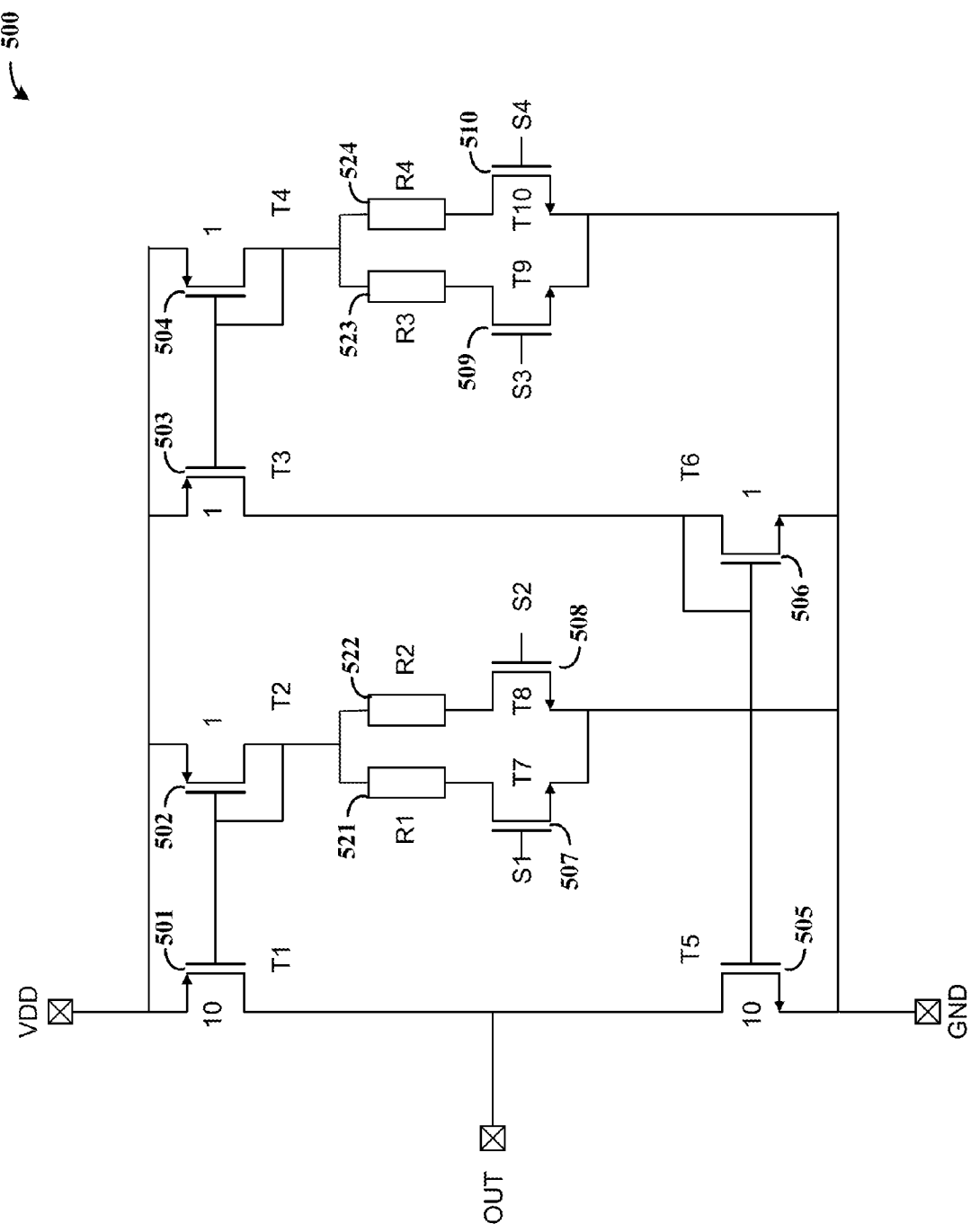
FIG. 5 shows current sources, as may be used in accordance with one or more embodiments herein.

A variety of current drivers/sources can be implemented in connection with one or more embodiments. FIG. 5 shows current sources, as may be used in accordance with one or more embodiments herein. Transistors 501, 502, 503 and 504 are connected to $V_{DD}$, and transistors 505 and 506 are connected to ground as shown. Transistors 501 and 505 are respectively coupled to the output port at drain/source regions. Resistors 521 and 522 are coupled in parallel respectively with transistors 507 and 508, between transistor 502 and ground. Resistors 523 and 524 are coupled in parallel, respectively with transistors 509 and 510, between transistor 504 and ground. The slope current is defined by resistor R1 (521) for the high-side and R3 (523) for the low-side. The static current is determined by resistor R2 (522) for the high-side and R4 (524) for the low-side. The currents are calculated by the following formula:

$$I_{SLOPEH} = \frac{V_{DD} - V_{GST2}}{R1} \cdot 10 \text{ or } I_{SLOPEL} = \frac{V_{DD} - V_{GST4}}{R3} \cdot 10$$

$$I_{STATICH} = \frac{V_{DD} - V_{GST2}}{R2} \cdot 10 \text{ or } I_{STATICL} = \frac{V_{DD} - V_{GST4}}{R4} \cdot 10$$

The absolute current may vary with temperature and process spread via the resistors and PMOS dependency, in which the high-side and low-side circuits match via components (R1=R3; R2=R4, T2=T3=T4). In some implementations, transistors T1 and T5 are scaled such that the capacitance is the same, therein matching the turn-on delay. The output driver can be disabled by making S1, S2, S3 and S4 low, resulting in zero quiescent current. In various implementations, all transistors have a drain-source break-down voltage above the maximum $V_{DD}$ supply voltage, and are implemented with the maximum gate-source voltage independent from the VDD supply (e.g., a maximum 3.3V or lower).

Various blocks, modules or other circuits may be implemented to carry out one or more of the operations and activities described herein and/or shown in the figures. In these contexts, a "block" (also sometimes "logic circuitry" or "module") is a circuit that carries out one or more of these or related operations/activities (e.g., communications). For example, in certain of the above-discussed embodiments, one or more modules are discrete logic circuits or programmable logic circuits configured and arranged for implementing these operations/activities, as in the circuit modules shown in the Figures. In certain embodiments, such a programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

Certain embodiments are directed to a computer program product (e.g., nonvolatile memory device), which includes a machine or computer-readable medium having stored thereon instructions which may be executed by a computer (or other electronic device) to perform these operations/activities.

Based upon the above discussion and illustrations, those skilled in the art will readily recognize that various modifications and changes may be made to the various embodiments without strictly following the exemplary embodiments and applications illustrated and described herein. For example, while certain embodiments and figures may be implemented in connection with an output driver on a peripheral device, other embodiments are directed to implementation with a microcontroller (e.g., with output driver 114 of FIG. 1). Such modifications do not depart from the true spirit and scope of various aspects of the invention, including aspects set forth in the claims.

What is claimed is:

1. For use in an automotive electrical communication apparatus, an integrated circuit chip comprising:
an output port at which an output signal is provided;
a first set of multiple current drivers;
a second set of multiple current drivers; and a signal-driver circuit configured and arranged with
a high-side circuit configured and arranged to drive current via the output port by activating the first set of multiple current drivers until a steady-state high voltage is detected, and by deactivating one of the current drivers in the first set when the steady-state high voltage is detected, and
a low-side circuit configured and arranged to drive current via the output port by activating the second set of multiple current drivers until a steady-state low voltage is detected, and by deactivating one of the current drivers in the second set when the steady-state low voltage is detected, wherein at least one of the high-side circuit and low-side circuit includes a static current driver configured and arranged to provide a low current, and a sloped current driver configured and arranged to provide a high current.

2. The integrated circuit chip of claim 1, further including a first control circuit configured and arranged to provide a first control signal for a first condition in which the output port provides the steady-state high voltage.

3. The integrated circuit chip of claim 1, further including a second control circuit configured and arranged to provide a second control signal for a second condition in which the output port provides the steady-state low voltage.

4. The integrated circuit chip of claim 1,
further including a feedback circuit coupled to the output port and including a comparator, the feedback circuit being configured and arranged to provide an output indicative of a voltage level on the output port,
wherein each set of multiple current drivers includes a static current driver configured and arranged to provide a low current, and a sloped current driver configured and arranged to provide a high current,
wherein the high-side circuit includes first and second switches that respectively couple the static and sloped current drivers of the high-side circuit between a voltage source and the output port, the first switch being responsive to an input voltage level and the second switch being responsive to the input voltage level and the output of the feedback circuit,
wherein the low-side circuit includes third and fourth switches that respectively couple the static and sloped current drivers of the low-side circuit between the output port and a reference voltage, the third switch being responsive to the input voltage level and the fourth switch being responsive to the input voltage level and the output of the feedback circuit.

5. The integrated circuit chip of claim 1, wherein the high-side circuit is configured and arranged to:
activate the first set of multiple current drivers until the steady-state high voltage is detected by driving a first one of the current drivers in the first set to provide a high current and by driving a second one of the current drivers in the first set to provide a low current, therein providing a rising edge of a voltage level on the output port, and
deactivate one of the current drivers in the first set when the steady-state high voltage is detected by deactivating the first one of the current drivers in the first set, therein providing a steady state voltage level on the output port.

6. The integrated circuit chip of claim 5, wherein the low-side circuit is configured and arranged to:
activate the second set of multiple current drivers until the steady-state low voltage is detected by driving a first one of the current drivers in the second set to provide a high current and by driving a second one of the current drivers in the second set to provide a low current, therein providing a falling edge of a voltage level on the output port, and
deactivate one of the current drivers in the second set when the steady-state high voltage is detected by deactivating the first one of the current drivers in the second set, therein providing a steady state voltage level.

7. The integrated circuit chip of claim 1, wherein the low-side circuit is configured and arranged to:
activate the second set of multiple current drivers until the steady-state low voltage is detected by driving a first one of the current drivers in the second set to provide a high current and by driving a second one of the current drivers in the second set to provide a low current, therein providing a falling edge of a voltage level on the output port, and
deactivate one of the current drivers in the second set when the steady-state high voltage is detected by deactivating the first one of the current drivers, therein providing a steady state voltage level.

8. The integrated circuit chip of claim 1, wherein
each set of multiple current drivers includes a static current driver configured and arranged to provide a low current, and a sloped current driver configured and arranged to provide a high current, and
the signal-driver circuit is configured and arranged to generate the output signal exhibiting a voltage level having:
a steady-state low value by activating the static current driver of the low-side circuit,
a rising edge by activating the sloped current driver and the static current driver of the high-side circuit,
a steady-state high value by activating the static current driver of the high-side circuit, and
a falling edge by activating the sloped current driver and the static current driver of the low-side circuit.

9. The integrated circuit chip of claim 8, wherein the signal-driver circuit is configured and arranged to generate the output signal exhibiting the voltage levels having:
the steady-state low value by operating the sloped current driver of the low-side circuit and both the static and sloped current drivers of the high-side circuit in a deactivated mode,
the rising edge by operating the sloped current driver and the static current driver of the low-side circuit in a deactivated mode,
the steady-state high value by operating the sloped current driver of the high-side circuit and both the static and sloped current drivers of the low-side circuit in a deactivated mode, and
the falling edge by operating the sloped current driver and the static current driver of the high-side circuit in a deactivated mode.

10. The integrated circuit chip of claim 1, wherein the first set of multiple current drivers is symmetrical to the second set of multiple current drivers and configured and arranged to provide current of equal magnitude and opposite sign, relative to current provided by the second set of current drivers.

11. A peripheral device configured and arranged to communicate with a microcontroller via an automotive network, the peripheral device comprising:
a communication circuit including an input port at which signals are received from the microcontroller and an output port at which an output signal is provided to the microcontroller;
a high-side circuit including a first set of multiple current drivers and being configured and arranged to drive current via the output port by activating the first set of multiple current drivers until a steady-state high voltage is detected, and by deactivating one of the current drivers in the first set when the steady-state high voltage is detected; and a low-side circuit including a second set of multiple current drivers and configured and arranged to drive current via the output port by activating the second set of multiple current drivers until a steady-state low voltage is detected, and by deactivating one of the current drivers in the second set when the steady-state low voltage is detected.

12. The peripheral device of claim 11, wherein each set of multiple current drivers includes a static current driver configured and arranged to provide a low current, and a sloped current driver configured and arranged to provide a high current, and the high-side and low-side circuits are configured and arranged to generate the output signal exhibiting a voltage level having:
  a steady-state low value by activating the static current driver of the low-side circuit and by operating each of the sloped current driver of the low-side circuit and both the static and sloped current drivers of the high-side circuit in a deactivated mode,
  a rising edge by activating the sloped current driver and the static current driver of the high-side circuit and by operating the sloped current driver and the static current driver of the low-side circuit in a deactivated mode,
  a steady-state high value by activating the static current driver of the high-side circuit, and by operating the sloped current driver of the high-side circuit and both the static and sloped current drivers of the low-side circuit in a deactivated mode, and
  a falling edge by activating the sloped current driver and the static current driver of the low-side circuit, and by operating the sloped current driver and the static current driver of the high-side circuit in a deactivated mode.

13. A method for use in an integrated circuit chip of an automotive electrical communication apparatus, the method comprising:
  in a high-side circuit, driving current via an output port at which an output signal is provided, by activating a first set of multiple current drivers until a steady-state high voltage is detected, and by deactivating one of the current drivers in the first set when the steady-state high voltage is detected, and
  in a low-side circuit, driving current via the output port by activating a second set of multiple current drivers until a steady-state low voltage is detected, and by deactivating one of the current drivers in the second set when the steady-state low voltage is detected, wherein in at least one of the high-side circuit and low-side circuit, driving current via the output port includes selectively driving a static current driver to provide a low current and driving a sloped current driver to provide a high current.

14. The method claim 13, wherein the steps of driving current include providing respective control signals for driving current in the high-side circuit and in the low-side circuit.

15. The method claim 13, wherein driving current via the output port in each of the high-side and low-side circuits includes selectively driving a static current driver to provide a low current, and driving a sloped current driver to provide a high current, by
  providing a steady-state low value by activating the static current driver of the low-side circuit,
  providing a rising edge by activating the sloped current driver and the static current driver of the high-side circuit,
  providing a steady-state high value by activating the static current driver of the high-side circuit, and
  providing a falling edge by activating the sloped current driver and the static current driver of the low-side circuit.

16. The method of claim 15, wherein
  providing the steady-state low value includes operating the sloped current driver of the low-side circuit and both the static and sloped current drivers of the high-side circuit in a deactivated mode,
  providing the rising edge includes operating the sloped current driver and the static current driver of the low-side circuit in a deactivated mode,
  providing the steady-state high value includes operating the sloped current driver of the high-side circuit and both the static and sloped current drivers of the low-side circuit in a deactivated mode, and
  providing the falling edge includes operating the sloped current driver and the static current driver of the high-side circuit in a deactivated mode.

17. The method claim 13, wherein driving current via the output port in each of the high-side and low-side circuits includes selectively driving a static current driver to provide a low current, and driving a sloped current driver to provide a high current, by
  in the high-side circuit, selectively coupling the static and sloped current drivers between a voltage source and the output port, based on an input voltage level and feedback indicative of a voltage level on the output port,
  in the low-side circuit, selectively coupling the static and sloped current drivers between the output port and a reference voltage in response to the input voltage level and the feedback.

18. The method claim 13, wherein:
  activating the first set of multiple current drivers until a steady-state high voltage is detected includes driving a first one of the current drivers in the first set to provide a high current and by driving a second one of the current drivers in the first set to provide a low current, therein providing a rising edge of a voltage level on the output port, and
  deactivating one of the current drivers in the first set when the steady-state high voltage is detected includes deactivating the first one of the current drivers in the first set, therein providing a steady state voltage level on the output port.

19. The method of claim 18, wherein
  activating the second set of multiple current drivers until the steady-state low voltage is detected includes driving a first one of the current drivers in the second set to provide a high current and by driving a second one of the current drivers in the second set to provide a low current, therein providing a falling edge of a voltage level on the output port, and
  deactivating one of the current drivers in the second set when the steady-state high voltage is detected includes deactivating the first one of the current drivers in the second set, therein providing a steady state voltage level.

20. The method claim 13, wherein
  activating the second set of multiple current drivers until the steady-state low voltage is detected includes driving a first one of the current drivers in the second set to provide a high current and by driving a second one of the current drivers in the second set to provide a low current, therein providing a falling edge of a voltage level on the output port, and deactivating one of the current drivers in the second set when the steady-state high voltage is detected includes deactivating the first one of the current drivers, therein providing a steady state voltage level.

* * * * *